United States Patent [19]

Kobayashi et al.

[11] Patent Number: 5,537,293

[45] Date of Patent: Jul. 16, 1996

[54] IC CARD HAVING AN ELECTRONIC APPARATUS

[75] Inventors: Fumiyuki Kobayashi; Manabu Deguchi, both of Tokyo, Japan

[73] Assignee: NEC Corporation, Tokyo, Japan

[21] Appl. No.: 356,654

[22] Filed: Dec. 15, 1994

[30] Foreign Application Priority Data

Dec. 28, 1993  [JP]  Japan .................................. 5-335277
Dec. 28, 1993  [JP]  Japan .................................. 5-335278

[51] Int. Cl.⁶ ............................................. H05K 1/14
[52] U.S. Cl. .......................... 361/737; 361/796; 361/755; 361/801; 439/74; 235/487
[58] Field of Search ........................... 361/737, 739, 361/752, 755, 796, 801; 235/441, 486, 487, 492; 439/44, 74; 206/328–331; 365/52

[56] References Cited

U.S. PATENT DOCUMENTS 5,183,404  2/1993  Aldous et al, .
5,337,220  8/1994  Granitz .................................. 361/816
5,373,149  12/1994  Rasmussen .............................. 235/492

FOREIGN PATENT DOCUMENTS

0610025A1   8/1994   European Pat. Off. .
41124151A1  10/1991  Germany .
61-090288   8/1986   Japan .
2277841     11/1994  United Kingdom .
WO8800790A1 1/1988   WIPO .
WO9409461A1 4/1994   WIPO .

OTHER PUBLICATIONS

European Search Report.
J. Greenfield. "Contamination Seal for Program Cartridges" *IBM Technical Disclosure Bulletin* vol. 26 No. 11 Apr. 1984.

*Primary Examiner*—Leo P. Picard
*Assistant Examiner*—Y. Whang
*Attorney, Agent, or Firm*—Whitham, Curtis, Whitham & McGinn

[57] ABSTRACT

A personal computer (PC) card comprises a PC card section and a casing section with a built-in electronic circuit provided at one end of the PC card section, and the PC card section and the casing section are integrated into a single structure. At the other end of the PC card section is provided a female interface connector, and in the connecting part between the PC card section and the casing section is arranged an elastic protective member. By inserting the PC card section into a slit section of a compact data terminal and connecting the female interface connector to a male interface connector, the PC card is actuated. In this configuration, when the PC card is inserted into the terminal, the protective member prevents the connecting part from being damaged by any force working on the casing section.

5 Claims, 5 Drawing Sheets

IC CARD HAVING AN ELECTRONIC APPARATUS

BACKGROUND OF THE INVENTION

The present invention relates to an IC card with a built-in integrated circuit, and more particularly to an IC card having an electronic apparatus, such as a radio modem.

Conventional IC cards having ! an electronic apparatus are connected to various compact data terminals such as a personal computer. For instance, an IC card using a radio modem as an electronic apparatus can transfer by radio the data in the personal computer. Such IC cards are often referred to as personal computer cards or PCMCIA (Personal Computer Memory Card International Association) cards, and will be hereinafter called PC cards in this specification.

A compact data terminal has a slit section into which a card can be inserted and a male interface connector within the slit section.

PC card comprises a PC card section and a casing section provided at one end of the PC card section and has a built in electronic circuit, and the PC card section and the casing section are integrated into a single structure. At the other end of the PC card section is provided a female interface connector.

Therefore, by inserting the PC card section into the slit section and thereby connecting the male and female interface connectors, the PC card can be actuated to become ready for use.

However, this PC card according to the prior art involves the problem that, because, when the PC card is fitted to a compact data terminal, a gap is left between the electronic apparatus of the card and the terminal, a stress will arise in the vicinity of the connecting part 10 between the PC card section and the casing section and damage will occur in and around the part if, for instance, a load is applied from above on the casing section, as will be described in more detail below.

SUMMARY OF THE INVENTION

An object of the present invention, therefore, is to obviate the aforementioned disadvantage, and to provide a PC card which will not be damaged even if a load is applied to it when inserted into a terminal.

According to the invention, there is provided an IC card having an electronic apparatus comprising an IC card section having an integrated circuit. An electronic apparatus section is provided at one end of this IC card section. An elastic protective member is provided in the vicinity of the connecting part between the electronic apparatus section and the IC card section.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION OF THE PREFERRED EMBODIMENTS

First, to facilitate better understanding of the present invention, the prior art will be described with reference to FIGS. 1 and 2.

Figure 1:
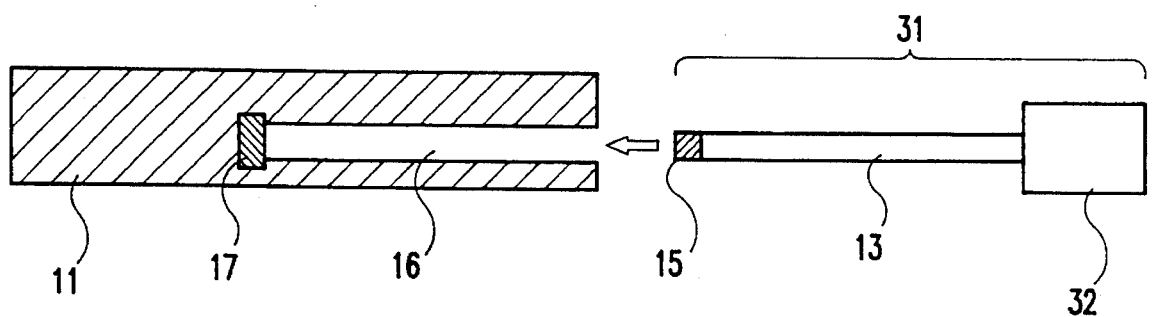
FIGS. 1 and 2 are illustrations for explaining a problem of the conventional PC card.
Figure 2:
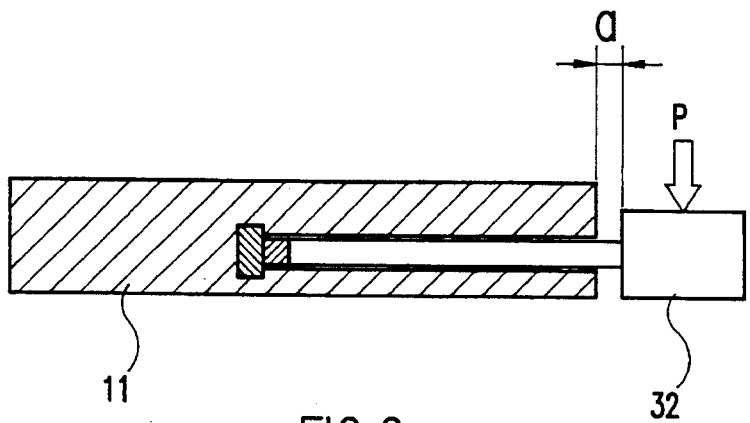

In FIGS. 1 and 2, a compact data terminal 11 has a slit section 16 into which a card section 13 can be inserted and a male interface connector 17 within the slit section 16.

Card-integrated electronic apparatus 31 comprises a PC card section 13 and a casing section 32 provided at one end of the PC card section 13 and having a built-in electronic circuit. The PC card section 13 and the casing section 32 are integrated into a single structure. At the other end of the PC card section 13 is provided a female interface connector 15. By inserting the PC card section 13 into the slit section 16 and thereby connecting the male interface connector 17 and the female interface connector 15, the PC card-integrated electronic apparatus 31 can be actuated to become ready for use.

However, this PC card according to the prior art had the problem that, because, when the PC card is fitted to the compact data terminal 11, a gap a as shown in FIG. 2 is left between the electronic apparatus of the card and the terminal, stress will arise in the vicinity of the connecting part between the PC card section 13 and the casing section 32 and damage will occur in and around the part if, for instance, a load P is applied on the casing section 32 in the direction represented by the arrow.

Figure 3:
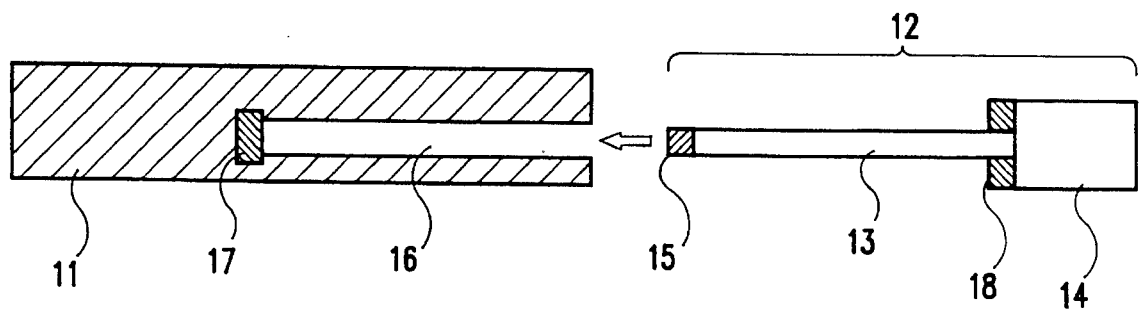
FIGS. 3 and 4 show side views of a first embodiment of the present invention.
Figure 4:
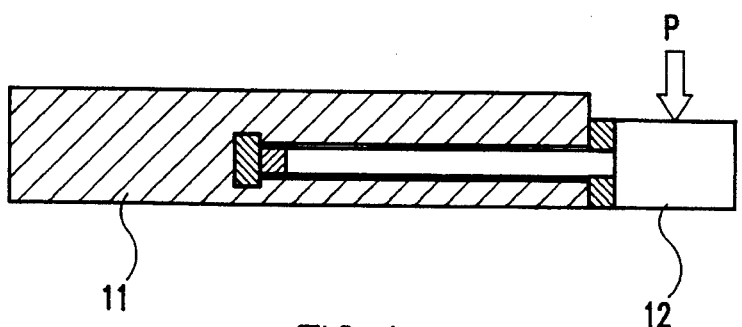

FIGS. 3 and 4 are profiles (with a partial cross-sectional view) illustrating a first preferred embodiment of the present invention. A PC card 12 to be fitted to and used in a compact data terminal 11 has a shape in which a PC card section 13 and a casing section 14 are combined. At one end of the PC card section 13 is provided a female interface connector 15.

On the other hand, the compact data terminal 11 has a slit section 16, and within the slit section 16 is provided a male interface connector 17 (FIG. 3).

By inserting the PC card section 13 into the slit section 16 and thereby connecting the male interface connector 17 of the compact data terminal 11 and the female interface connector 15 of the PC card section 13, the card-integrated electronic apparatus 12 be actuated to become ready for use (FIG. 4). In the connecting part 10 between the PC card section 13 and the casing section 14 of the PC card 12 is arranged a protective member 18 made of an elastic material such as rubber. The protective member 18 has a thickness substantially equal to the gap which is left between the compact data terminal 11 and the casing section 14 when the PC card section 13 of the card-integrated electronic apparatus 12 is inserted, and fixed to the peripheries of the connecting faces of the casing section 14 and the PC card section 13.

Figure 5:
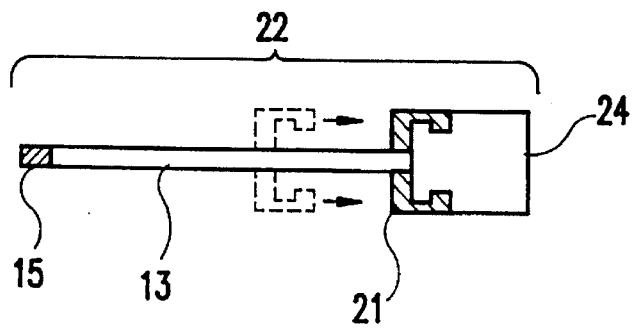
FIGS. 5–7 show side views of a second embodiment of the present invention.
Figure 6:
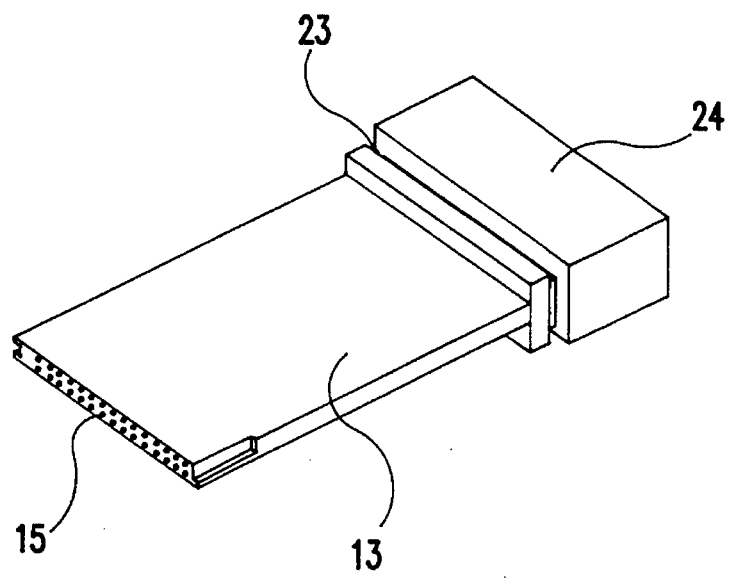
Figure 7:
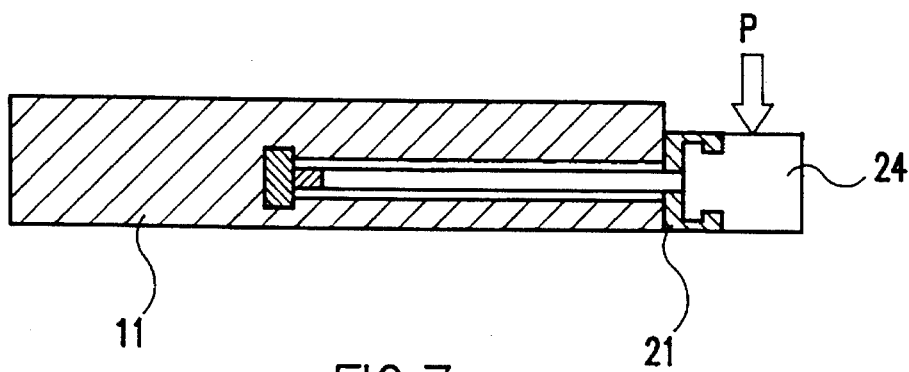

Next will be described a second preferred embodiment of the invention with reference to FIG. 5.

The second embodiment differs from the first embodiment in that the protective member is detachable from the card-integrated electronic apparatus. The protective member 21 here, formed substantially in a frame shape, is engaged while being pressed against a groove section 23 formed in a headband shape around the surface of a casing section 24 of this card-integrated electronic apparatus 2, and fixed to the casing section 24.

Both in the first and second embodiments, the gap left between the compact data terminal 11 and the casing section 14 or 24 of the PC card-integrated electronic apparatus 12 or 22 can be respectively filled with the protective member 18 or 21.

Therefore, the stress arising in and around the connecting part between the PC card section 13 and the casing section 14 when the load P is applied on the casing section 14 of the card-integrated electronic apparatus 12 can be eased, and damage can be thereby prevented.

Figure 8:
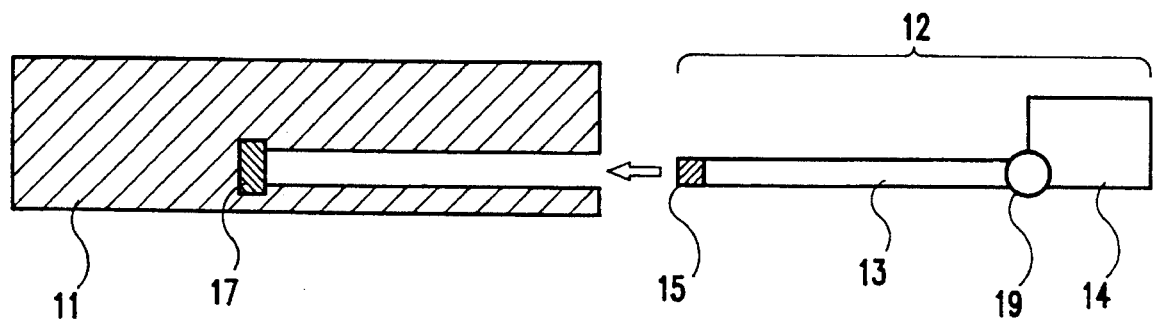
FIGS. 8–10 show side views of a third embodiment of the present invention.
Figure 9:
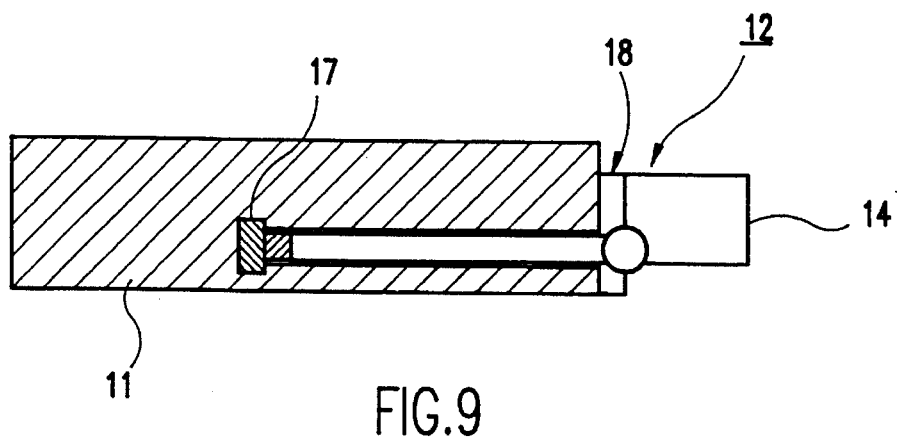
Figure 10:
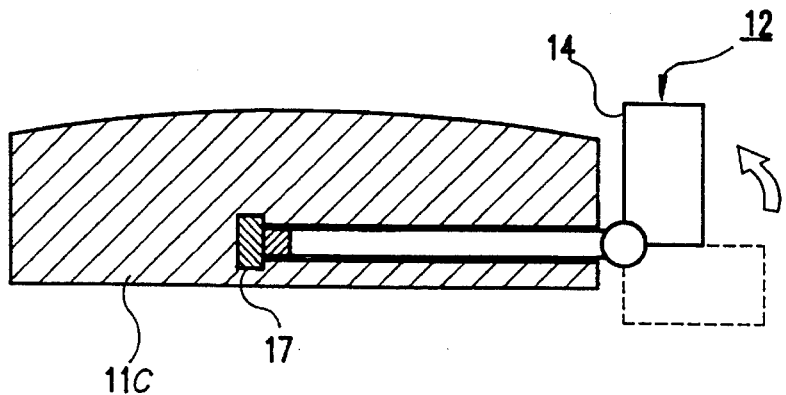

FIGS. 8 through 10 illustrate a third preferred embodiment of the present invention. This third embodiment is a PC card which not only is protected from damage but also can be inserted into a terminal irrespective of whether the front or back face of the inserting section of the PC card is upward.

A PC card 12, which is the third embodiment of the invention, has a PC card section 13 having a female interface connector 15 at one of its ends and a casing section 14 having an electronic circuit inside. The PC card section 13 and the casing section 14 are connected to each other by a swingable hinge section 19. In this example, the illustration of the protective member is dispensed with in order to highlight the hinge, which is the particular feature of this third embodiment.

The PC card section 13 and the casing section 14 are also connected electrically by a connecting member such as a flexible printed board. Further by using within the hinge section 19 a bush member utilizing elasticity or frictional force, the PC card section 13 and the casing section 14 may be held in any desired angle of swing.

Referring to FIG. 9, when it is uncertain as to whether the front face of the male interface connector 17 within the small data terminal 11 should be upward or downward, even in a compact data terminal 11C into which, as illustrated in FIG. 10, the PC card-integrated electronic apparatus 12 is to be inserted in the reverse direction to that in FIG. 9, the casing section 14 can be prevented from projecting from the bottom of the compact data terminal 11C by swinging this casing section 14.

Figure 11:
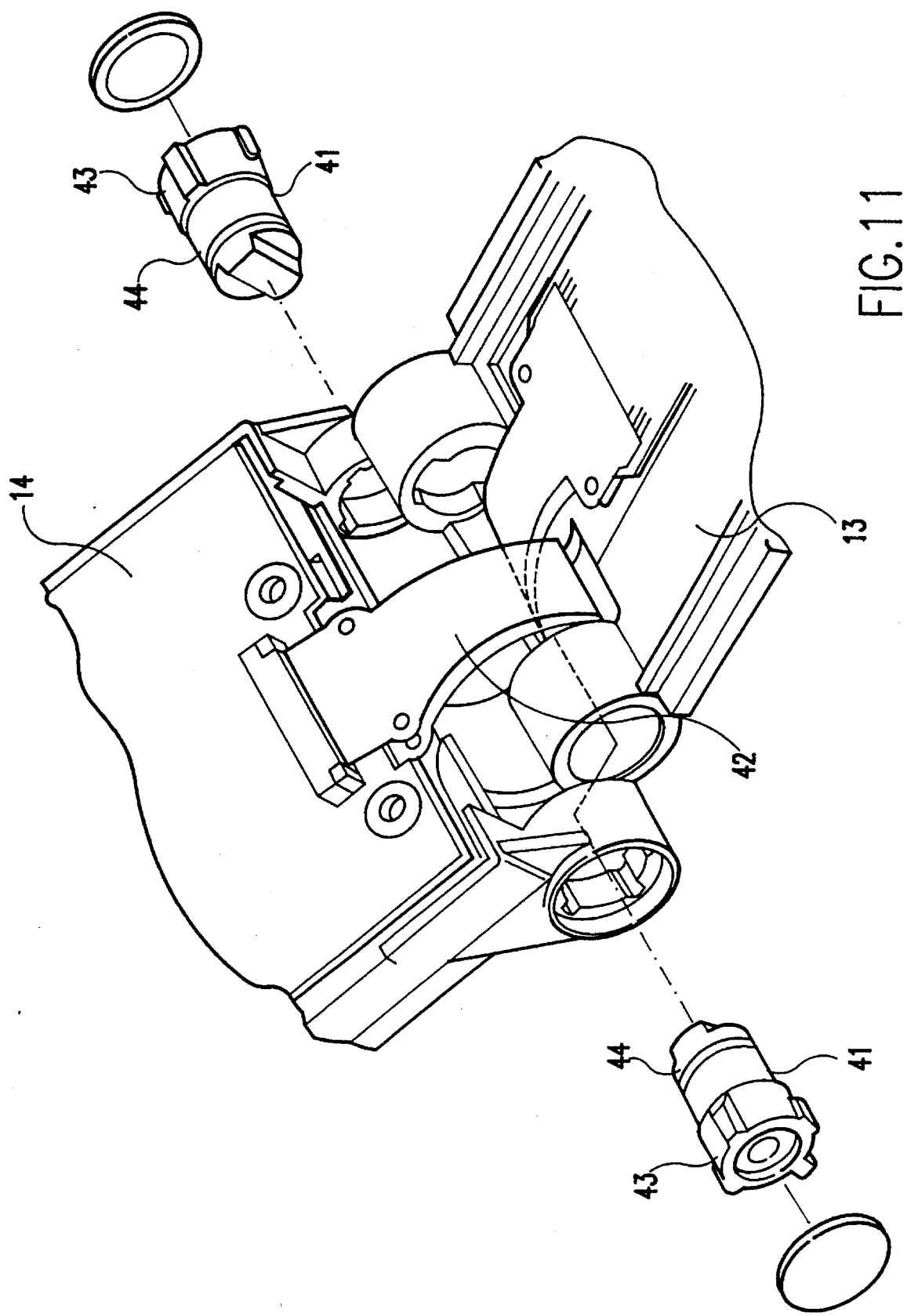
FIG. 11 shows a detail of a hinge section.

Referring to FIG. 11, the PC card section 13 is electrically connected to the casing section 14 by a flexible print wire circuit sheet 42. A bush member 41 is used to hold the PC card section 13 and the casing section 14 in any desired angle of swing. The bush member includes a first element 43 and a second element 44 which are connected together through a shaft. Each of the two elements 43 and 44 rotates independently around the shaft using frictional force. Therefore, when the elements 44 and 43 are fixed to the PC card section 13 and the casing section 14, respectively, the two sections 13 and 14 are connected together by the bush member, and the two sections can be held at any angle by the bush member 41.

What is claimed is:

1. An integrated circuit (IC) card having an electronic apparatus comprising:

an IC card section having an integrated circuit;

an electronic apparatus section provided at one end of said IC card section; and an elastic protective member provided in the vicinity of a connecting part between said electronic apparatus section and said IC card section.

2. An IC card, as claimed in claim 1, wherein said protective member is detachable from said IC card.

3. An IC card, as claimed in claim 1, wherein a connector for connection to an external terminal is provided at the other end of said IC card.

4. An IC card, as claimed in claim 1, wherein said IC card section and said electronic apparatus are connected to each other by a hinge section.

5. An integrated circuit (IC) card having an electronic apparatus comprising:

an IC card section having an integrated circuit;

an electronic apparatus section connected swingably to one end of said IC card section by a hinge section; and an elastic protective section provided in the vicinity of said hinge section.

* * * * *